United States Patent [19]

Wollesen

[11] 3,727,078

[45] Apr. 10, 1973

[54] INTEGRATED CIRCUIT BALANCED MIXER APPARATUS

[75] Inventor: Donald L. Wollesen, San Jose, Calif.

[73] Assignee: National Semiconductor Corporation, Santa Clara, Calif.

[22] Filed: Mar. 30, 1972

[21] Appl. No.: 239,549

Related U.S. Application Data

[63] Continuation of Ser. No. 21,104, March 19, 1970.

[52] U.S. Cl. ....................307/233, 307/304, 332/44, 330/35

[51] Int. Cl. ....................H03k 5/20

[58] Field of Search....................330/15, 29, 35; 313/298, 300; 332/43 B, 44; 307/205, 251, 279, 304

[56] References Cited

UNITED STATES PATENTS

| | | | |
|---|---|---|---|
| 3,383,601 | 5/1968 | Squires | 332/43 B |
| 3,275,950 | 9/1966 | Birr | 322/44 |
| 3,284,711 | 11/1966 | Messenger | 332/44 |
| 3,264,413 | 8/1966 | Merritt | 307/304 |
| 3,513,405 | 5/1970 | Carlson | 330/29 |

FOREIGN PATENTS OR APPLICATIONS

| | | | |
|---|---|---|---|
| 641,362 | 12/1963 | Belgium | 307/304 |

*Primary Examiner*—Herman Karl Saalbach
*Assistant Examiner*—R. E. Hart
*Attorney*—Harvey G. Lowhurst et al.

[57] ABSTRACT

Balanced mixer circuit apparatus using two matched integrated circuit field effect transistors as active elements wherein one input signal is applied to the gates of the transistors in push-pull relationship and a second input signal is applied to the substrates of the transistors in a common mode push-push manner. Both input signals thus look into capacitive loads which for practical purposes can be considered to be open circuits, thereby averting any harmonic distortion which might otherwise be produced by loading of the input drive circuits.

5 Claims, 2 Drawing Figures

PATENTED APR 10 1973 3,727,078

INVENTOR
DONALD L. WOLLESEN

BY [signature]
ATTORNEY

INTEGRATED CIRCUIT BALANCED MIXER APPARATUS

This is a continuation of application Ser. No. 21,104, filed Mar. 19, 1970.

BACKGROUND OF THE INVENTION

1. Field of the Invention

The present invention relates generally to radio frequency balanced mixers and, more particularly, to a novel balanced mixer circuit using a matched dual junction field effect transistor having separate diffused gates and a common substrate gate.

2. Discussion of the Prior Art

The usual method of suppressing one of the input signal components input to a mixer is to employ a balanced mixer or modulator which consists of two identical amplifiers arranged in a push-pull configuration. In the case of vacuum tube amplifiers, one input signal is applied to the cathodes of each amplifier tube in the same phase while the second or modulating signal is applied in opposite phase to the grids of the two tubes by means of a center tapped transformer. The outputs of the two tubes are then combined through a transformer with a center tapped primary. When the system is symmetrical, the first input signal does not appear in the output because it is applied in the same phase to the two tubes and hence cancels in the primary of the output transformer. On the other hand, the second input components generated in the two amplifiers are of opposite phase because the modulating signal voltages are applied thereto in phase opposition. The push-pull signal is filtered out thus leaving only the side bands at the output.

Attempts have been made to use matched field effect transistors (FETs) and junction field effect transistors (JFETs) in circuits similar to the prior art vacuum tube circuits wherein the gates of the FETs were driven with one input signal while the source terminals were tied together and driven with the other input signal. The problem with this arrangement is that the application of the common mode signal to the sources causes circuit loading and circuit interaction, both of which degrade the mixer performance.

Another disadvantage has been the near impossibility of obtaining matched FETs and JFETs. However, a recent innovation made by the National Semiconductor Corporation of Santa Clara, California, relating to dual monolithic JFETs has obviated the matching problem and a novel use of such monolithic dual circuits is embodied in the present invention.

OBJECTS OF THE INVENTION

It is therefore a primary object of the present invention to provide a novel balanced mixer circuit which utilizes a pair of field effect transistors in a novel manner to overcome the disadvantages inherent in prior art circuits.

Another object of the present invention is to provide a novel balanced mixer circuit utilizing FETs as amplifying stages, having control gates which are driven with one input signal and substrate gates which are driven with the other input signal.

Still another object of the present invention is to provide a novel balanced mixer circuit utilizing a monolithic dual JFET wherein the source electrodes are coupled together and one input signal is applied to the gate electrodes while the other input signal is applied to the substrate.

SUMMARY OF THE PRESENT INVENTION

The present invention relates to a novel balanced mixer circuit utilizing matched field effect transistors. The source terminals of the two transistors are coupled together and one input signal is applied to the gate electrodes in a push-pull manner while the other signal is applied to the substrate of the FETs in a push-push manner. In accordance with the invention, both input signals look into capacitive loads which, for practical purposes, can be considered to be open circuits so that neither of the drive signals is loaded. This tends to substantially decrease any harmonic distortion and provides superior mixing operation. This feature is extremely desirable in frequency synthesizers, and the like, wherein many harmonics are mixed together, since the fewer unwanted harmonics appearing in the output signal the better the quality of the synthesizer.

An important feature of a preferred embodiment of the present invention is that a monolithic dual JFET provides the active elements which are by definition matched, thus eliminating the sorting and matching problems that made utilization of FETs heretofore impractical.

Another advantage of the present invention is that since there is no material loading of any of the inputs, the harmonic distortion produced is substantially reduced and both inputs have square law transfer characteristics.

These and other advantages of the present invention will become apparent to those skilled in the art after having read the following detailed description of the present invention which is illustrated in the several figures of the drawing.

IN THE DRAWING

DETAILED DESCRIPTION OF THE PREFERRED EMBODIMENTS

Figure 1:
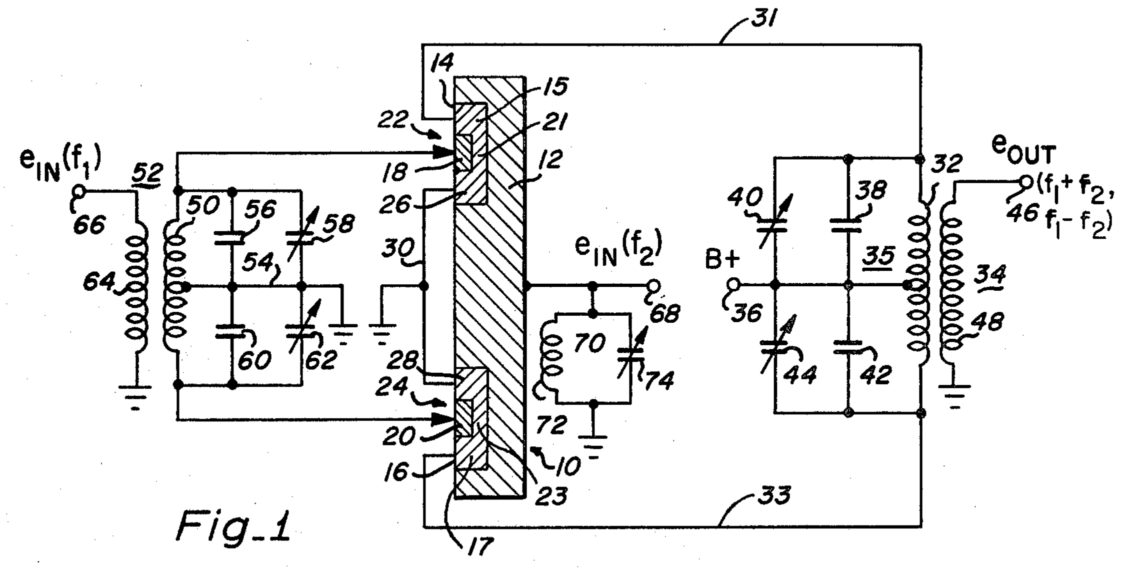
FIG. 1 is a schematic diagram showing a balanced mixer in accordance with a preferred embodiment of the present invention.

A field effect transistor (FET) can be described as a semiconductive resistive impedance element whose conductance is controlled by a transverse electric field created across a conductive channel between a gate and a substrate region. Since it is the property of a reverse biased p-n junction, between low and high resistivity materials, that the depletion region extends into the high resistivity material as the biasing voltage is increased, the controlling electric field in the junction FET is normally established in the channel by reverse biasing the gate-to-channel p-n junction. However, it has been found that the controlling electric field can likewise be established by reverse biasing the substrate-to-channel p-n junction. An increasing voltage applied across either p-n junction will constrict the channel more and more until at a certain voltage, called the pinch-off voltage, the current allowed to flow through the channel is cut off. Thus, variation of the potentials applied across either the gate-to-channel p-n junction (forming the control gate) or the substrate-to-channel p-n junction (forming the substrate gate) or both, will have the effect of modulating the channel current so long as the applied voltages are less than the pinch-off voltage of the device.

In the insulated gate or metal-oxide-silicon (MOS) FET, the conducting channel is normally modulated by the electric field developed across the dielectric layer when voltage is applied to the gate. However, as in the JFET, the channel conductance can also be varied by applying a control voltage to the substrate, and the theoretical explanation of the resultant change in channel conductance is quite similar to that of the JFET.

FETs have characteristics which resemble somewhat those of pentode vacuum tubes. That is, they have high input impedance, approximately unilateral amplification, and a constant current output characteristic. The control gate of the FET is analogous to the control grid of the vacuum tube; the drain is analogous to the plate, and the source is analogous to the cathode. Where the substrate is used as a second gate, the pentode analogy can be carried still further by equating the substrate gate to the screen grid of a pentode.

The present invention takes advantage of the fact that the extent of the depletion region into the channel of an FET can be increased from either the gate side or the substrate side so as to constrict the channel and thus increase the resistance of current flow from source to drain. In the present invention, a first input signal $f_1$, applied to the control gates of the two FETs in a push-pull manner, is filtered out by the output tuned circuit causing a zero output to be generated in the output circuit, provided that the balance transformers are made correctly, while a second input signal $f_2$, applied to the substrate in a push-push manner, causes the sum and difference signals ($f_1 + f_2$ and $f_1 - f_2$) to appear in the output circuit. Both the substrate gate and the diffused gate have square law transfer characteristics which are independent of the load line, i.e., the bias on either of the diffused gates can be taken anywhere in the active region of the device. In other words, the drain currents in the two devices still follow a square law function no matter whether the input signal is applied to the substrate gate or the diffused control gate, or to both.

By feeding two separate signals of different frequency into the respective input terminals, output signals are obtained which include the first input frequency, the second input frequency and the sum and the difference of the first and second input frequencies. Since the first input circuit is push-pull and is filtered out at the output, and the second input circuit is push-push, both input signals cancel in the output circuit so that the only signals that pass to the output terminal are the sum and difference frequencies. Either the sum or the difference frequency can then be selected by filtering out the unwanted signal. This means that an ideal square law mixer is provided wherein neither one of the input frequencies appears at the output.

A significant advantage of using FETs in mixer circuits stems from the fact that in an FET the channel current never crosses a p-n junction, and they draw no drive power to speak of, and distortion caused by load impedance variations is virtually nonexistant. This is also apparent in low noise parameters operating from high impedance signal sources. Junction FET amplifiers have noise figures of less than 3 db over a frequency range of from DC to 50 kilohertz for generator impedances varying from 3 kilohms to 30 megohms. Since junction FETs have high input impedance, excellent input parameter stability with input currents ranging from $10^{-11}$ to $10^{-7}$ amps at a 1 to 2 vol bias level are available for use in high input impedance circuits.

Referring now to FIG. 1 of the drawing, the balanced mixer of the present invention is shown to include a dual impedance means in the form of a monolithic dual JFET 10 such as the FM3954 manufactured by the National Semiconductor Corporation of Santa Clara, California. The JFET structure includes a substrate 12 of a first conductivity type having bodies 14 and 16 of the opposite conductivity type processed into one side thereof. Control gate regions 18 and 20 of the first conductivity type are usually diffused across the bodies 14 and 16 to provide source and drain regions 26–15 and 28–17 joined by conductive channels 21 and 23 respectively forming the matched JFETs 22 and 24. Because of the topography and manner in which the above mentioned monolithic dual JFETs are formed in the substrate 10, they have closely matched operational characteristics.

The monolithic dual 10 is incorporated into the illustrated mixer circuit by coupling the sources 26 and 28 together by a grounded lead 30. The drain 14 of transistor 22 is connected to one side of a tuned output circuit 35 comprised of the center tapped primary 32 of an output transformer 34; the drain 16 of transistor 24 is connected to the other side of output circuit 35. The center tap 36 of primary 32 is connected to B+ (for an *n* channel FET) at terminal 36. A capacitor 38 and a trim capacitor 40 are coupled in parallel between the top side of primary 32 and the center tap thereof, and a fixed capacitor 42 and trim capacitor 44 are coupled in parallel between the center tap and the bottom side of primary 32. The circuit output is taken at an output terminal 46 which is connected to the top side of the secondary winding 48 of transformer 34. The bottom side of secondary winding 48 is connected to circuit ground.

The control gate 18 of transistor 22 is connected to the top side of the secondary winding 50 of an input transformer 52, and the control gate 20 of transistor 24 is connected to the bottom side of winding 50. Coupled between the top side of secondary 50 and the center tap 54 thereof, is a fixed capacitor 56 and a trim capacitor 58 coupled in parallel, and connected between the bottom side of the secondary 50 and the center tap 54 is the parallel combination of a second fixed capacitor 60 and a trim capacitor 62. The center tap 54 is connected to circuit ground.

An input signal $e_{in}(f_1)$ applied to primary winding 64 at input terminal 66 will be applied to the mixer circuit in a push-pull manner, i.e., in the form of a first modulating signal which is applied to gate region 18 and a second modulating signal which is 180° out of phase with the first modulating signal and applied to gate 20. The other input signal $e_{in}(f_2)$ is applied to the substrate 12 of the dual JFET structure 10 so as to feed the second signal into the mixer circuit in a push-push manner, i.e., $e_{in}(f_2)$ is applied in phase and simultaneously to both of the substrate gates of transistors 22 and 24. A signal trapping circuit 70, comprised of an inductor 72 and capacitor 74 coupled together in parallel, is connected between the input terminal 68 and circuit ground. This trapping circuit is a tuned circuit which allows the desired input frequency to be applied to substrate 12, but shunts spurious frequency components to ground. In response to the application of input signals $e_{in}(f_1)$ and $e_{in}(f_2)$ to transistors 22 and 24, a first mixed signal commensurate with the sum of $e_{in}(f_1)$ and $e_{in}(f_2)$ will be developed on line 31, and a second mixed signal commensurate with the difference betweeh $e_{in}(f_1)$ and $e_{in}(f_{2a})$ will be developed on line 33. In response to the mixed signals, output circuit 35 is operative to develop an output signal $e_{out}$ which includes the sum and difference frequency $f_1+f_2$ and $f_1-f_2$.

In the illustrated preferred embodiment, the source, drain and channel regions of the transistors 22 and 24 are of p-type material, and the gate regions 18 and 20 are of p-type material. The p-n junctions bordering the gate regions are reverse biased so that their resistance is high and very little current flows through the junctions to the source or drain regions. Since the current flow through the channels of the transistors 22 and 24 is a function of the difference in potential between gate and substrate across the channel, it will be noted that the input circuit looks into capacitive loads which because of the high resistances at the p-n junctions are basically open circuits for practical purposes. Accordingly, there is little or no loading of either of the input signals. The harmonic distortion of the circuit is very low. This provides for a much cleaner mixer operation than is obtainable in prior art devices.

Figure 2:
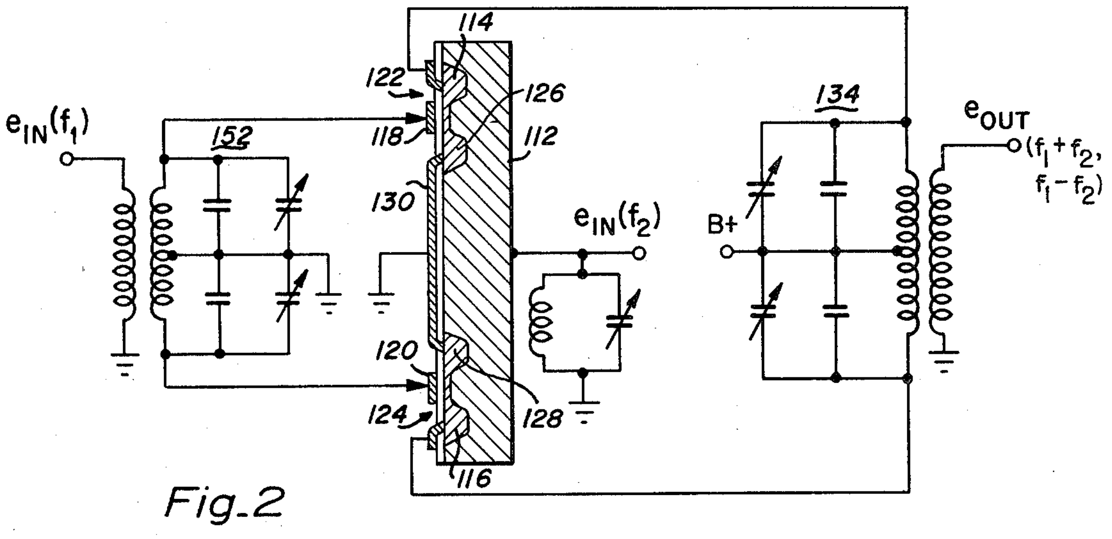
FIG. 2 is a schematic diagram showing an alternate embodiment of the present invention.

Turning now to FIG. 2 of the drawing, a similar circuit is illustrated wherein, instead of using a dual junction FET structure, a dual MOS FET structure is utilized. The structure includes MOS FETs 122 and 124 wherein the control gate 118 of transistor 122 is coupled to the top side of the input tuned circuit 152, and the control gate 120 of transistor 124 is coupled to the bottom side of the tuned circuit 152. As in the previous embodiment, the sources 126 and 128 of the two transistors are coupled together and grounded as shown at 130, and the drain 114 of transistor 122 is connected to the top side of tuned circuit 134 while the drain 116 of transistor 124 is connected to the bottom side thereof.

The operation of this circuit is substantially identical to that of the previously described embodiment in that one input signal $e_{in}(f_1)$ is applied in push-pull manner to the metallic control gates 118 and 120, while the other input signal $e_{in}(f_2)$ is applied to the common substrate, i.e., to the substrate gates. In both devices, the electric fields created across the channel regions give rise to the mixing action.

While the invention has been described with particular reference to two preferred embodiments, it is apparent that many alterations and modifications may be made to the invention without departing from the merit thereof. It is therefore to be understood that this description is for purposes of illustration only and it is in no way intended to be limiting. Accordingly, I intend that the appended claims be interpreted as covering all alterations and modifications which may fall within the true spirit and scope of my invention.

What is claimed is:

1. Balanced mixer circuit apparatus comprising:
a first semiconductive body of a first conductivity type having first and second field effect transistors disposed therein, each of said field effect transistors having a control gate, a source and drain, said first body forming a substrate gate common to said first and second transistors;
means electrically coupling the sources of said first and second transistors together;
first input circuit means for coupling a first input signal of a first frequency in push-pull relationship to the control gates of said first and second transistors;
second input circuit means for coupling a second input signal of a second frequency to said substrate gate;
a source of DC potential coupled in circuit across the source and drain of said first and second transistors; and
output circuit means coupled between the drains of said first and second transistors, whereby said first and second signals simultaneously drive said first and second field effect transistors to develop an output signal in said output circuit means including the sum and difference frequencies of said first and second input signals.

2. Balanced mixer circuit apparatus as recited in claim 1 wherein said first and second transistors are matched junction field effect transistors including, second bodies of semiconductive material of a second conductivity type forming first pn junctions with said first body, and third bodies of semiconductive material of said first conductivity type forming second pn junctions with said second bodies.

3. Balanced mixer circuit apparatus as recited in claim 1 wherein said first input circuit means includes a first center tapped transformer having its center tap coupled to one side of said source of potential, and said output circuit includes a second center tapped transformer having its center tap coupled to the other side of said source of potential.

4. Balanced mixer circuit apparatus as recited in claim 1 wherein said second input circuit means includes a filter for allowing only signals of said second frequency to be coupled into said semiconductive body.

5. Balanced mixer circuit apparatus as recited in claim 1 wherein said first and second transistors are matched metal oxide silicon field effect transsistors including, source, drain and channel regions of a second conductivity type forming pn junctions with said first body, and metallic control gate electrodes separated from said channel regions by a layer of electrically insulated material.

* * * * *